United States Patent
Murata

(10) Patent No.: US 9,859,861 B2
(45) Date of Patent: Jan. 2, 2018

(54) HIGH FREQUENCY FILTER AND HIGH FREQUENCY MODULE EQUIPPED WITH SAME

(71) Applicant: TAIYO YUDEN CO., LTD., Tokyo (JP)

(72) Inventor: Ryuji Murata, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 203 days.

(21) Appl. No.: 14/890,853

(22) PCT Filed: Apr. 11, 2014

(86) PCT No.: PCT/JP2014/060462
§ 371 (c)(1),
(2) Date: Nov. 12, 2015

(87) PCT Pub. No.: WO2014/185200
PCT Pub. Date: Nov. 20, 2014

(65) Prior Publication Data
US 2016/0118951 A1    Apr. 28, 2016

(30) Foreign Application Priority Data
May 17, 2013 (JP) .................. 2013-104946

(51) Int. Cl.
*H03H 1/00* (2006.01)
*H01P 1/203* (2006.01)
(Continued)

(52) U.S. Cl.
CPC .......... *H03H 1/00* (2013.01); *H01P 1/20345* (2013.01); *H03H 7/0123* (2013.01); *H01G 17/00* (2013.01); *H03H 2001/0085* (2013.01)

(58) Field of Classification Search
CPC .. H01P 1/203; H01P 1/20345; H01P 1/20336; H03H 7/0123
(Continued)

(56) References Cited

U.S. PATENT DOCUMENTS

| | | | |
|---|---|---|---|
| 8,031,035 B2* | 10/2011 | Chernyakov | H01P 1/20345 333/134 |
| 2003/0102941 A1 | 6/2003 | Amano et al. | |
| 2008/0100401 A1* | 5/2008 | Cho | H01P 1/20345 333/204 |

FOREIGN PATENT DOCUMENTS

| | | |
|---|---|---|
| JP | 2001-118734 | 4/2001 |
| JP | 2002-026605 | 1/2002 |

(Continued)

OTHER PUBLICATIONS

Office Action dated Mar. 15, 2017 in Japanese Application 2013-104946.
(Continued)

Primary Examiner — Stephen E Jones
(74) Attorney, Agent, or Firm — Pillsbury Winthrop Shaw Pittman, LLP

(57) ABSTRACT

To provide a smaller-sized high frequency filter. In a high frequency filter according to an embodiment of the invention, two filter circuits each equipped with a first externally coupling capacitor having one end coupled to an input-output terminal, a wavelength shortening capacitor having one end coupled to other end of the externally coupling capacitor and having other end coupled to the ground potential, and a resonator having one end coupled to the other end of the externally coupling capacitor and the one end of the wavelength shortening capacitor, having other end coupled to the ground potential, and being formed of a distributed constant line. The two filter circuits are broadside-coupled to each other.

8 Claims, 5 Drawing Sheets

(51) Int. Cl.
*H03H 7/01* (2006.01)
*H01G 17/00* (2006.01)

(58) Field of Classification Search
USPC .................. 333/204, 203, 205, 202, 185
See application file for complete search history.

(56) References Cited

FOREIGN PATENT DOCUMENTS

| JP | 2003-115710 A | 4/2003 |
|---|---|---|
| JP | 2003-198206 A | 7/2003 |
| JP | 2005-109950 | 4/2005 |
| JP | 2006-005799 | 1/2006 |
| JP | 2006-186828 A | 7/2006 |
| JP | 2007-097113 A | 4/2007 |
| JP | 2008-288661 | 11/2008 |

OTHER PUBLICATIONS

International Preliminary Report on Patentability dated Nov. 17, 2015 for Appln. No. PCT/JP2014/060462.
International Search Report dated Jul. 15, 2014 for Appln. No. PCT/JP2014/060462.
Non-Final Office Action issued in Japanese Patent Application No. 2013-104946 dated Sep. 26, 2017 with English translation.

\* cited by examiner

HIGH FREQUENCY FILTER AND HIGH FREQUENCY MODULE EQUIPPED WITH SAME

CROSS REFERENCE TO RELATED APPLICATIONS

This application is the U.S. National Stage of PCT/JP2014/060462, filed Apr. 11, 2014, which in turn claims priority to Japanese Patent Application Serial No. 2013-104946, filed May 17, 2013, the entire contents of all applications are hereby incorporated by reference in their entireties.

TECHNICAL FIELD

The present invention relates to a high frequency filter and a high frequency module equipped with the same, more specifically, a high frequency filter having a stack of a plurality of dielectric layers and a high frequency module equipped with the same.

BACKGROUND

In recent years, standardizations of wireless communication system which allows a high-speed data communication have been made in order to meet demands for large-capacity data communication using terminals such as mobile phones and smartphones. For instance, when a new wireless communication system such as Long Term Evolution (LTE) and the like is implemented, some terminals are still required to conform to conventional standards or different standards in abroad so that front-ends of such terminals may have relatively increased sizes. To minimize the sizes of the front-ends, a Front End Module (FEM), which is a high frequency module, can be used. It is preferable that low-loss and small/thin high-frequency filters be used for such high frequency modules. For instance, a multilayer filter that utilizes an inductive coupling of resonators which include lumped parameter elements (see, for example, Patent Document 1), a multilayer filter that utilizes a capacitive coupling of resonators which use distributed constant lines (see, for example, Patent Document 2) and the like have been proposed.

RELEVANT REFERENCES

List of Relevant Patent Literature

Patent Document 1: Japanese Patent Application Publication No. 2001-118734
Patent Document 2: Japanese Patent Application Publication No. 2008-288661

SUMMARY

When a high-frequency domain multilayer filter is configured to include a lumped parameter circuit, it is common to use a series or parallel resonator using LC. In this case, a magnetic field generated by an inductor is directed to the vertical direction (a multilayer stacking direction) and this may deteriorate the performance of the multilayer filter that has the elements in the stacking direction. To avoid this, elements are arranged in the horizontal direction in the multilayer filter and this means that there is a limit for size reduction of the filter in the horizontal direction. Meanwhile, when the high-frequency domain multilayer filter is configured to include a distributed constant circuit, it is preferable that a high dielectric material is used to obtain a wavelength shortening effect. However, the dielectric material may cause disadvantages such as loss in wiring and parasitic components.

One object of the invention is to provide a smaller-sized high frequency filter. Other objects of the invention will be apparent with reference to the entire description in this specification.

An embodiment of the invention provides a high frequency filter including a stack of a plurality of dielectric layers. The filter includes a first input-output terminal; a second input-output terminal; a first externally coupling capacitor having one end coupled to the first input-output terminal; a first wavelength shortening capacitor having one end coupled to other end of the first externally coupling capacitor and having other end coupled to an ground potential; a first resonator having one end coupled to the other end of the first externally coupling capacitor and the one end of the first wavelength shortening capacitor, and having other end coupled to the ground potential, the first resonator being formed of a distributed constant line; a second externally coupling capacitor having one end coupled to the second input-output terminal; a second wavelength shortening capacitor having one end coupled to other end of the second externally coupling capacitor and having other end coupled to an ground potential; and a second resonator having one end coupled to the other end of the second externally coupling capacitor and the one end of the second wavelength shortening capacitor, and having other end coupled to the ground potential, the second resonator being formed of a distributed constant line and broadside-coupled to the second resonator.

According to another embodiment of the invention, provided is a high frequency module equipped with the above-described high frequency filter.

Various embodiments of the present invention may provide smaller-sized high frequency filters.

DESCRIPTION OF THE PREFERRED EMBODIMENTS

Figure 1:
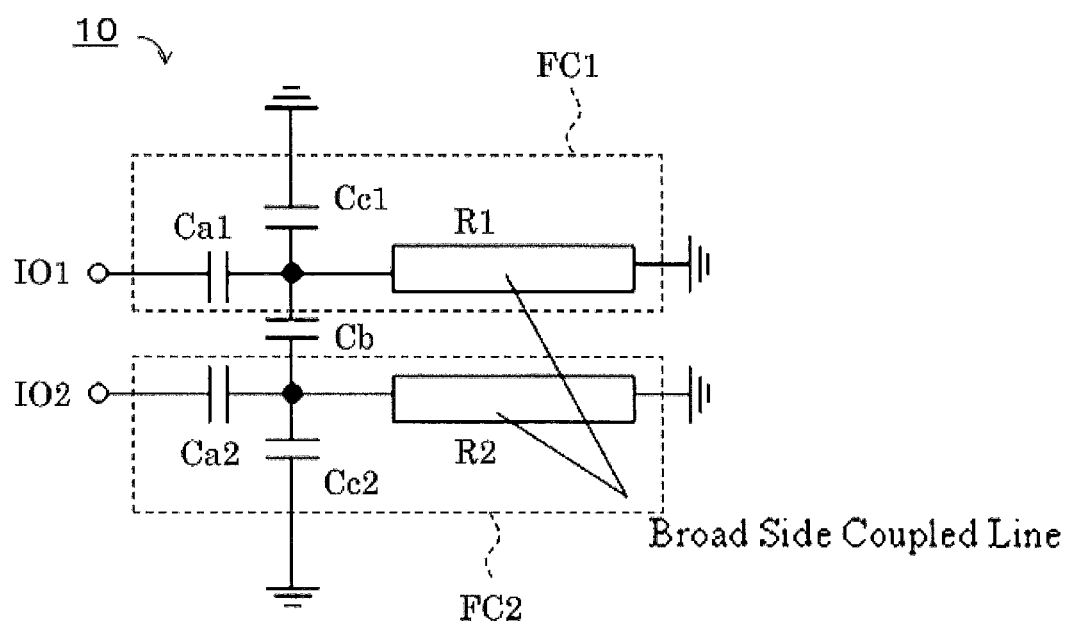
FIG. 1 is an equivalent circuit schematic of a high frequency filter according to one embodiment of the invention.

Various embodiments of the present invention will be described hereinafter with reference to the drawings. In the drawings, the same components are denoted by the same reference numerals.

FIG. 1 is a representative circuit schematic of a high frequency filter 10 according to one embodiment of the invention. Referring to FIG. 1, the high frequency filter 10 according to the embodiment may include an externally coupling capacitor Ca1 having one end coupled to an input-output terminal IO1, a wavelength shortening capacitor Cc1 having one end coupled to the other end of the externally coupling capacitor Ca1 and having other end coupled to the ground potential, and a resonator R1 having one end coupled to the other end of the externally coupling capacitor Ca1 and the one end of the wavelength shortening capacitor Cc1, and having other end coupled to the ground potential. The Resonator R1 may include a distributed constant line. The high frequency filter 10 may further include an externally coupling capacitor Ca2 having one end coupled to an input-output terminal IO2, a wavelength shortening capacitor Cc2 having one end coupled to the other end of the externally coupling capacitor Ca2 and having other end coupled to the ground potential, and a resonator R2 having one end coupled to the other end of the externally coupling capacitor Ca2 and the one end of the wavelength shortening capacitor Cc2 and having other end coupled to the ground potential. The resonator R2 may include a distributed constant line. The high frequency filter 10 may further include an internally coupling capacitor Cb having one end coupled to the other end of the externally coupling capacitor Ca1, the one end of the wavelength shortening capacitor Cc1 and the one end of the resonator R1, and having other end coupled to the other end of the externally coupling capacitor Ca2, the one end of the wavelength shortening capacitor Cc2 and the one end of the resonator R2. The externally coupling capacitor Ca1, the wavelength shortening capacitor Cc1, and the resonator R1 may form a filter circuit FC1. The externally coupling capacitor Ca2, the wavelength shortening capacitor Cc2, and the resonator R2 may form a filter circuit FC2. The filter circuit FC1 may be coupled to the filter circuit FC2 through capacitive coupling of the internally coupling capacitor Cb and inductive coupling caused by a broadside coupling between the resonators R1 and R2.

Figure 2:
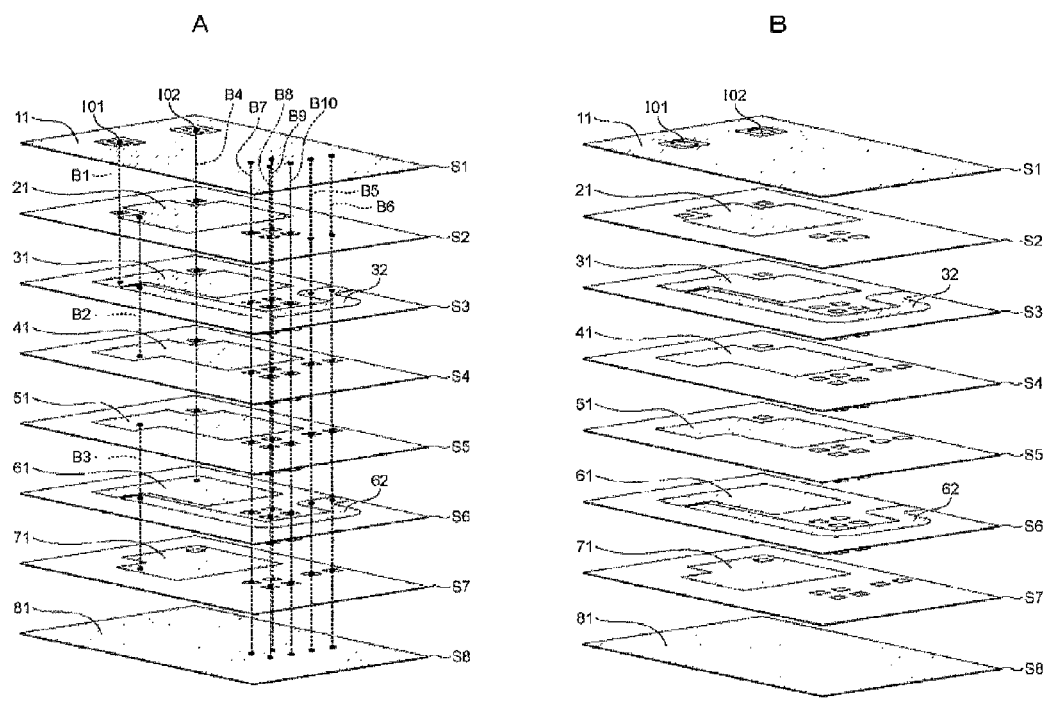
FIG. 2 is an explanatory diagram showing a multilayer structure of the high frequency filter according to the embodiment.
Figure 3:
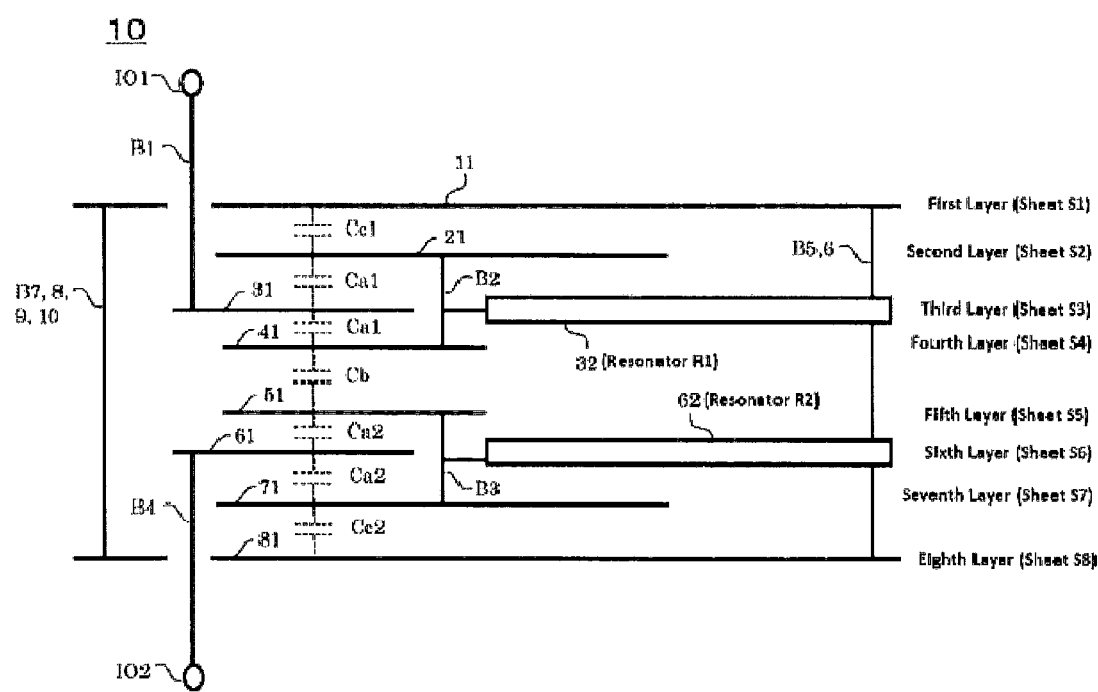
FIG. 3 is an explanatory diagram showing a correspondence relation between the equivalent circuit and the multilayer structure of the high frequency filter according to the embodiment.

FIG. 2 is an explanatory diagram showing a multilayer structure of the high frequency filter 10 according to the embodiment which realizes the equivalent circuit shown in FIG. 1. Referring to FIG. 2, the diagram A illustrates via electrodes B1-B10, but the via electrodes B1-B10 are omitted in the diagram B to make the diagram more visible. The high frequency filter 10 may be a multilayer filter of dielectric sheets in which electrodes and distributed constant lines are provided. In an embodiment, the high frequency filter 10 may be formed by sintering eight dielectric sheets S1-S8 together to obtain a low temperature co-fired ceramic (LTCC). FIG. 3 is an explanatory diagram showing a correspondence relation between the equivalent circuit and the multilayer structure of the high frequency filter 10 according to an embodiment. For the purpose of illustration, the input-output terminal IO2 is provided on the side of the sheet S8 (the terminal IO2 is actually provided on the sheet S1 side) in FIG. 3. Except for this, the filter may have the same structure as the multilayer structure of FIG. 2. Referring to FIG. 3, the externally coupling capacitor Ca1 included in the filter circuit FC1 shown in the equivalent circuit schematic of FIG. 1 may be formed of an electrode 31 of the sheet S3 and an electrode 41 of the sheet S4. The electrode 31 may be coupled to the input-output terminal IO1 through the via electrode B1. The wavelength shortening capacitor Cc1 also included in the filter circuit FC1 may be formed of an electrode 11 of the sheet S1 and an electrode 21 of the sheet S2. The externally coupling capacitor Ca2 included in the filter circuit FC2 may be formed of an electrode 61 of a sheet S6, an electrode 51 of a sheet S5, and an electrode 71 of the sheet S7. The externally coupling capacitor Ca2 may be coupled to the input-output terminal IO2 through the via electrode B4. The wavelength shortening capacitor Cc2 included in the filter circuit FC2 may be formed of an electrode 81 of the sheet S8 and an electrode 71 of the sheet S7. The internally coupling capacitor Cb coupling the filter FC1 to the filter circuit FC2 may be formed of the electrode 41 of the sheet S4 and the electrode 51 of the sheet S5. Here, the electrode 11 of the sheet S1 and the electrode 81 of the sheet 8 may be formed as ground planes.

The resonator R1 of the filter circuit FC1 is formed of a distributed constant line 32 bent into a substantially hook shape on the sheet S3 (see FIG. 2). The resonator R1 may be coupled to the electrode 21 of the sheet S2 included in the externally coupling capacitor Ca1 and the wavelength shortening capacitor Cc1, and to the electrode 41 of the sheet S4 included in the externally coupling capacitor Ca1 and the internally coupling capacitor Cb through the via electrode B2. The resonator R2 of the filter circuit FC2 is formed of a distributed constant line 62 bent into a substantially hook shape on the sheet S6 (see FIG. 2). The resonator R2 may be coupled to the electrode 71 of the sheet S7 included in the externally coupling capacitor Ca2 and the wavelength shortening capacitor Cc2, and to the electrode 51 of the sheet S5 included in the externally coupling capacitor Ca2 and the internally coupling capacitor Cb through the via electrode B3. The resonators R1, R2 may be coupled to the electrode 11 (ground plane) of the sheet S1 and the electrode 81 (ground plane) of the sheet S8 through the same via electrodes B5 and B6 respectively. The number of the via electrodes coupling the resonators R1, R2 to the electrodes 11, 81 respectively is not limited to two but may be one, three or more. In addition, the size of the via electrode is not particularly limited. The number and the size of the via electrodes affect the inductance of the wirings and it is preferable that larger number of the via electrodes be provided and the thickness of the via electrodes be larger. The electrode 11 of the sheet S1 and the electrode 81 of the sheet S8 may be electrically connected to each other through the four via electrodes B7, B8, B9, and B10. The via electrodes B7, B8, B9, and B10 may be configured to run through the space created by the hook-shaped bend sections of the distributed constant circuits 32, 62 of the resonators R1, R2.

Here, the resonators R1, R2 may be broadside-coupled to each other. More specifically, the distributed constant line 32 of the sheet S3 that forms the resonator R1 may be disposed in a position where it overlaps the distributed constant line 62 of the sheet S6 that forms the resonator R2 in the vertical direction (stacking direction). Accordingly, only signals having predetermined wave lengths which are determined by the lengths of the distributed constant lines (the length of straight portion of the distributed constant line 32, 62 on the open side) are transmitted from one resonator to the other resonator through the inductive coupling.

In the high frequency filter 10 according to such embodiment, the resonators R1, R2 (the distributed constant line 32, 62) may be broadside coupled. Therefore it is possible to reduce the size increase of the high frequency filter 10 in the horizontal direction compared to a case where the resonators R1, R2 are arranged next to each other in the horizontal direction to be edge-coupled.

Moreover, in the high frequency filter 10 according to the embodiment, the externally coupling capacitors Ca1, Ca2 coupled to the input-output terminals IO1,IO2 respectively are isolated from the ground potential (the electrodes 11, 81) by the wavelength shortening capacitors Cc1, Cc2. Therefore parasitic capacitance is not generated between the input-output terminals IO1, IO2 and the ground potential Consequently it is possible to arrange the sheets (sheets S3, S6) to which the input-output terminals are connected closer to the sheets (sheets S1, S8) of the ground potential. As a result, it is possible to reduce the thickness of the high frequency filter 10. Considering the ground-potential isolation feature and the wave-length shortening feature caused by the wavelength shortening capacitors Cc1, Cc2, it is preferable that the electrodes 21, 71 of the wavelength shortening capacitors Cc1, Cc2 have a sufficiently large area (for example, the electrodes have a configuration with which at least the open sides of the resonators R1, R2 (the region where the electric field is dominant) can be shield against the electrodes 11, 81).

Moreover, in the high frequency filter 10 according to the embodiment, the externally coupling capacitors Ca1, Ca2 may be disposed between the wavelength shortening capacitors Cc1, Cc2 and the internally coupling capacitor Cb. Since the wavelength shortening capacitors Cc1, Cc2 and the internally coupling capacitor Cb both form capacitive couplings with respect to the resonators R1, R2, it is possible to make the capacitances of the externally coupling capacitors Ca1, Ca2 substantially double the capacitance which is determined by the area of the corresponding electrode (when the gap distances to the upper layer and the under layer are equal).

In addition, since the resonators R1, R2 are formed of the distributed constant lines 32, 36 which are bent in the substantially hook shape, the length of the distributed constant line is decreased and consequently the inductance is increased. Furthermore, by bending the distributed constant line, it is possible to increase the freedom of layout and it is also possible to reduce the area in the horizontal direction.

Moreover, the ground plane is provided in the top and bottom dielectric sheets (sheets S1, S8) in the high frequency filter 10 according to the embodiment. Therefore extraneous influences from other wirings and the like running through the high frequency filter 10 in the vertical direction can be shield. In the same manner, extraneous influences from wirings and the like running in the horizontal direction can be shield by a shielding via electrode coupled to the ground plane of the sheets S1, S8 and formed in the lateral side of the high frequency filter 10. Moreover, since the via electrodes B7, B8, B9, B10 coupled to the ground planes of the sheets S1, S8 may be provided in the space created by the hook-shaped bend sections of the distributed constant circuits 32, 62 of the resonators R1, R2, it is possible to reduce a potential difference between the ground planes.

Figure 4:
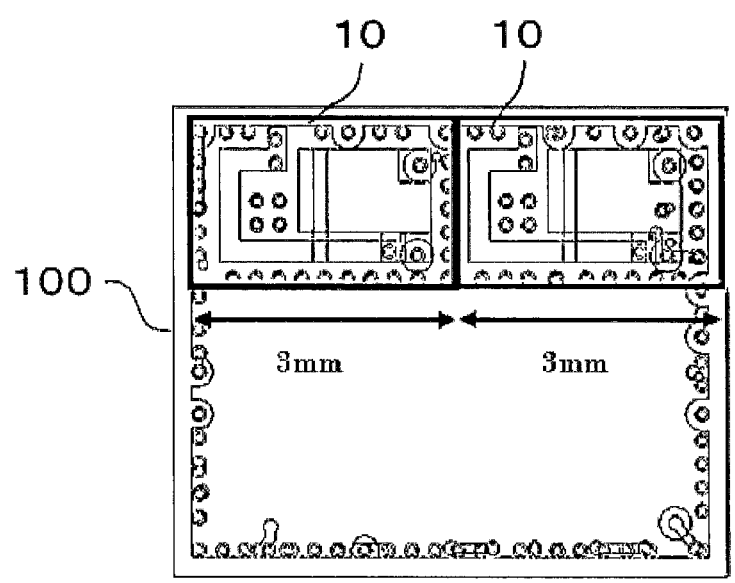
FIG. 4 is a top view of an exemplary high frequency module in which a high frequency filter according to the embodiment is provided.

FIG. 4 is a top view of an exemplary high frequency module 100 in which the high frequency filter 10 according to the embodiment is provided. In this embodiment, the two high frequency filters 10 may be arranged next to each other in the horizontal direction. Since the ground planes are provided at the top and bottom dielectric sheets (sheets S1, S8) in the high-frequency filter 10 according to the embodiment, the high frequency filter 10 can be placed directly below the components of the high frequency module.

Figure 5:
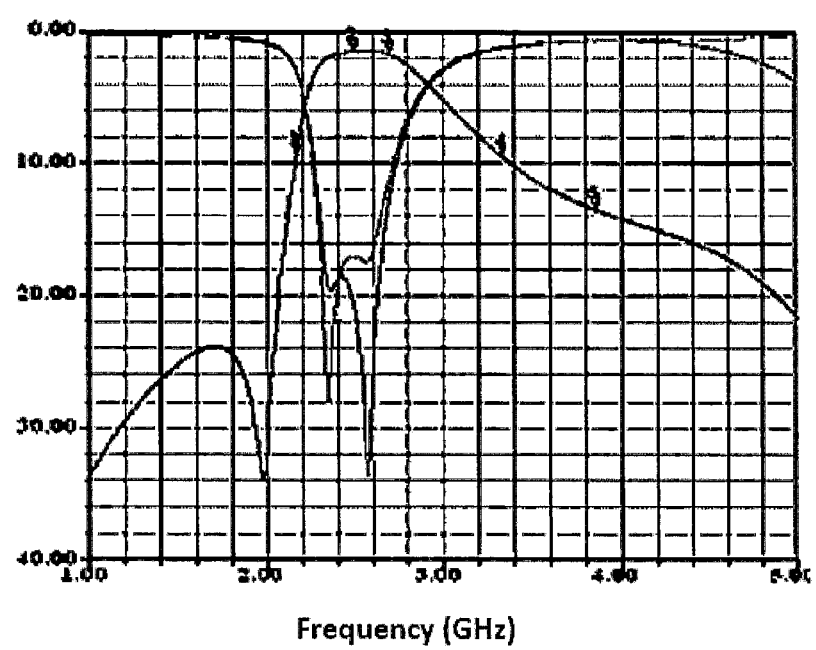
FIG. 5 is an explanatory diagram showing a multilayer structure of the high frequency filter according to the embodiment.

FIG. 5 is an explanatory diagram showing a characteristic of the high frequency filter 10 according to the embodiment. Referring to FIG. 5, the high frequency filter 10 of this example shows a band pass filter (BPF) characteristic having a passband of 2.5-2.7 GHz. As for the length of the resonator that resonates in this frequency range, when the resonance frequency is set to 2.6 GHz, for example, the wave length is 115.4 mm, the λ/4 resonator length is 28.8 mm, and the length of the wavelength shortening resonator due to a dielectric constant is 9.1 mm (when the dielectric constant is 10).

Because of the wavelength shortening effect of the wavelength shortening capacitors Cc and the inductance increase due to the resonators R1, R2 (distributed constant lines 32, 62) bent in the substantially hook shape, the width of the high frequency filter 10 according to the embodiment can be reduced to about 3 mm which is less than or equal to half the width of a typical resonator (see FIG. 4). Moreover, it is possible to implement the filter on a low dielectric-constant (less than or equal to 10) wiring substrate which has a less wavelength shortening effect.

LIST OF REFERENCE NUMBERS 10 high frequency filter
11, 21, 31, 41, 51, 61, 71, 81 electrode
32, 62 distributed constant line (resonator)
100 high frequency module
Ca1, Ca2 externally coupling capacitor
Cb internally coupling capacitor
Cc1, Cc2 wavelength shortening capacitor
FC1, FC2 filter circuit
IO1, IO2 input-output terminal
S1-S8 sheet
R1, R2 resonator

What is claimed is:

1. A high frequency filter having a stack of a plurality of dielectric layers, comprising;
    a first input-output terminal;
    a second input-output terminal;
    a first externally coupling capacitor having one end coupled to the first input-output terminal;
    a first wavelength shortening capacitor having one end coupled to another end of the first externally coupling capacitor and having another end coupled to a ground potential;
    a first resonator having one end coupled to the other end of the first externally coupling capacitor and the one end of the first wavelength shortening capacitor, and having another end coupled to the ground potential, the first resonator being formed of a distributed constant line;
    a second externally coupling capacitor having one end coupled to the second input-output terminal;
    a second wavelength shortening capacitor having one end coupled to another end of the second externally coupling capacitor and having another end coupled to the ground potential; and
    a second resonator having one end coupled to the other end of the second externally coupling capacitor and the one end of the second wavelength shortening capacitor, and having another end coupled to the ground potential, the second resonator being formed of a distributed constant line and broadside-coupled to the first resonator.

2. The high frequency filter according to claim 1, further comprising;
    an internally coupling capacitor having one end coupled to the other end of the first externally coupling capacitor, the one end of the first wavelength shortening capacitor, and the one end of the first resonator, and having another end coupled to the other end of the second externally coupling capacitor, the one end of the second wavelength shortening capacitor, and the one end of the second resonator.

3. The high frequency filter according to claim 1, wherein the first resonator and the second resonator are both coupled to the ground potential through a same via electrode.

4. The high frequency filter according to claim 1, wherein the first resonator and/or the second resonator is formed of a bent distributed constant line.

5. The high frequency filter according to claim 1, wherein ground planes are provided at the top and bottom dielectric layers.

6. The high frequency filter according to claim 5, wherein a part of lateral side of the filter has a shielding via electrode coupled to the ground planes provided at the top and bottom dielectric layers.

7. The high frequency filter according to claim 1, wherein the filter is formed of a low temperature co-fired ceramic (LTCC).

8. A high frequency module, comprising the high frequency filter according to claim 1.

* * * * *